(12) United States Patent
Nakamura

(10) Patent No.: US 8,222,963 B2
(45) Date of Patent: Jul. 17, 2012

(54) VOLTAGE-CONTROLLED OSCILLATOR

(75) Inventor: Yoshiaki Nakamura, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 29 days.

(21) Appl. No.: 12/784,837

(22) Filed: May 21, 2010

(65) Prior Publication Data

US 2010/0301956 A1    Dec. 2, 2010

(30) Foreign Application Priority Data

May 27, 2009    (JP) .................................. 2009-128038

(51) Int. Cl.
*H03B 5/12*    (2006.01)
(52) U.S. Cl. ............................... 331/117 FE; 331/177 V
(58) Field of Classification Search .............. 331/177 V, 331/36 C, 117 R, 117 FE, 167; 334/78, 11, 334/14, 15
See application file for complete search history.

(56) References Cited

U.S. PATENT DOCUMENTS

| | | | |
|---|---|---|---|
| 6,833,769 B2 * | 12/2004 | Seppinen et al. | 331/177 V |
| 7,098,751 B1 * | 8/2006 | Wong | 331/177 V |
| 7,321,271 B2 * | 1/2008 | Takinami et al. | 331/117 R |

FOREIGN PATENT DOCUMENTS

JP    2008-118550 A    5/2008

* cited by examiner

*Primary Examiner* — Ryan Johnson
(74) *Attorney, Agent, or Firm* — Sughrue Mion, PLLC

(57) ABSTRACT

A voltage-controlled oscillator includes a resonator section in which a plurality of types of variable capacitance elements having different structures and capacitance variation characteristics are connected in parallel and capacitance values of the plurality of types of variable capacitance elements are controlled simultaneously by a control voltage; and an amplifier section for maintaining oscillation produced by the resonator section. Varactor diodes and MOS varactors can be used as the variable capacitance elements.

6 Claims, 13 Drawing Sheets

VOLTAGE-CONTROLLED OSCILLATOR

REFERENCE TO RELATED APPLICATION

This application is based upon and claims the benefit of the priority of Japanese patent application No. 2009-128038, filed on May 27, 2009, the disclosure of which is incorporated herein in its entirety by reference thereto.

TECHNICAL FIELD

This invention relates to a voltage-controlled oscillator and, more particularly, to a voltage-controlled oscillator that utilizes the resonance phenomenon of an LC circuit.

BACKGROUND

A voltage-controlled oscillator having an LC resonator section that uses an inductor L and a variable capacitance element C the capacitance value of which is changed by a control voltage is known in the art. This voltage-controlled oscillator is further provided with an amplifier section for maintaining the oscillation produced by the LC resonator section, and a voltage-controlled oscillator in which the variable capacitance element used in the LC resonator section employs varactor diodes and one in which the LC resonator section employ MOS varactors are available.

Further, a voltage-controlled oscillator in which MOSFETs are used as variable capacitors in addition to varactor diodes is described in Patent Document 1. In the voltage-controlled oscillator described in Patent Document, an LC resonator circuit has an inductance section, a capacitance section and a control voltage terminal, and the capacitance section has serially connected varactor diodes and MOSFETs. The voltage control terminal is connected to the cathodes of the varactor diodes and to the gates of the MOSFETs and the capacitance can be changed more than previously by the control voltage applied to the control voltage terminal.
[Patent Document 1]
Japanese Patent Kokai Publication No. JP2008-118550A

SUMMARY

The entire disclosure of Patent Document 1 is incorporated herein by reference thereto.
The analysis below is given by the present invention. The resonator section of the voltage-controlled oscillator preferably has a broad control frequency range over which control is possible by the voltage applied to the voltage control terminal. Further, ideally the change in frequency is linear over the full control-voltage range (e.g., the range between the high- and low-potential power-supply voltages supplied to the voltage-controlled oscillator). A rate of change (modulation sensitivity) in frequency that is too high in a portion of the voltage range is undesirable. In a case where varactor diodes are used as the variable capacitance elements, the change in frequency is linear in comparison with MOS varactors but the control frequency range is narrow. In a case where MOS varactors are used, on the other hand, the control frequency range is broadened but there are instances where linearity is not obtained and the modulation sensitivity is too high in a portion of the range.
Thus there is much to be desired in the art.

According to a first aspect of the present invention there is provided a voltage-controlled oscillator, which includes: a resonator section in which a plurality of types of variable capacitance elements having different structures and capacitance variation characteristics are connected in parallel and capacitance values of the plurality of types of variable capacitance elements are controlled simultaneously by a control voltage; and an amplifier section that maintains oscillation produced by the resonator section.

According to a second aspect of the present invention there is provided a voltage-controlled oscillator, which includes a resonator section, and an amplifier section that maintains oscillation produced by the resonator section, wherein the resonator section includes: an inductor; a first MOS varactor and a second MOS varactor connected between respective ones of two ends of the inductor and a common node; a first varactor diode and a second varactor diode connected between respective ones of two ends of the inductor and a power supply so as to be reverse biased; a first resistor R1 connected between the common node and a voltage control terminal; and second and third resistors connected between respective ones of two ends of the inductor and the voltage control terminal.

According to a third aspect of the present invention there is provided a voltage-controlled oscillator, which includes a resonator section, and an amplifier section that maintains oscillation produced by the resonator section, wherein the resonator section includes: an inductor; a first MOS varactor and a second MOS varactor connected between respective ones of two ends of the inductor and a common node; a first varactor diode and a second varactor diode connected between respective ones of two ends of the inductor and a power supply so as to be reverse biased; a first resistor R1 connected between the common node and a voltage control terminal; and second and third resistors connected between respective ones of two ends of the inductor and the voltage control terminal.

The meritorious effects of the present invention are summarized as follows. In accordance with the present invention, the voltage-controlled oscillator has a resonator section in which a plurality of types of variable capacitance elements are connected in parallel and the capacitance values of the plurality of types of variable capacitance elements are controlled simultaneously. As a result, a voltage-controlled oscillator that exploits the advantages of each of the variable capacitance elements and suppresses the drawbacks thereof is obtained.

In particular, in a case where MOS varactors and varactor diodes are used as the variable capacitance elements connected in parallel, a voltage-controlled oscillator is obtained in which the control frequency range is broad and there is no region where the modulation sensitivity is too high.

Other features and advantages of the present invention will be apparent from the following description taken in conjunction with the accompanying drawings, in which like reference characters designate the same or similar parts throughout the figures thereof.

PREFERRED MODES

Preferred modes of the present invention are described, making reference to the drawings as necessary. Cited drawings and reference symbols of the drawings in the description of the preferred modes indicate one example of the preferred modes, and variations of the preferred of modes according to the present invention are not limited thereby.

As illustrated in FIGS. 1 to 3, FIG. 12 and FIG. 13, by way of example, a voltage-controlled oscillator 1 according to a preferred mode includes a resonator section in which a plurality of types of variable capacitance elements (varactor diodes D1 to D4 and MOS varactors C1, C2) having different structures and capacitance variation characteristics are connected in parallel and capacitance values of the plurality of types of variable capacitance elements (C1, C2, D1 to D4) are controlled simultaneously by a control voltage (supplied from a voltage control terminal VC); and an amplifier section (M1 to M4, CC) for maintaining oscillation produced by the resonator section. Since the variable capacitance elements of the plurality of types are connected in parallel and the capacitance values of the variable capacitance elements of the plurality of types are controlled simultaneously, a voltage-controlled oscillator that exploits the advantages of each of the variable capacitance elements and suppresses the drawbacks thereof is obtained.

The voltage-controlled oscillator 1 of a preferred mode is such that the variable capacitance elements of the plurality of types are MOS varactors and varactor diodes. A MOS varactor is such that the capacitance value thereof varies greatly when the control voltage is near the threshold value of a MOS transistor, although the rate of change in the capacitance value with respect to the applied voltage slows down markedly when the control voltage departs from the threshold value. In particular, depending upon the application, there are instances where the modulation sensitivity in the vicinity of the threshold value is too high. On the other hand, in comparison with a MOS varactor, a varactor diode exhibits an applied voltage vs. capacitance value change characteristic that is nearly linear over a broad range of voltages. However, since the range of change in capacitance is small, the control frequency range is narrow. By virtue of the arrangement described above, the MOS varactors and varactor diodes are connected in parallel and the capacitance values of the MOS varactors and varactor diodes are controlled simultaneously. As a result, a voltage-controlled oscillator is obtained in which the range of control frequency is broad and there is no a region where the modulation sensitivity is too high.

Figure 1:
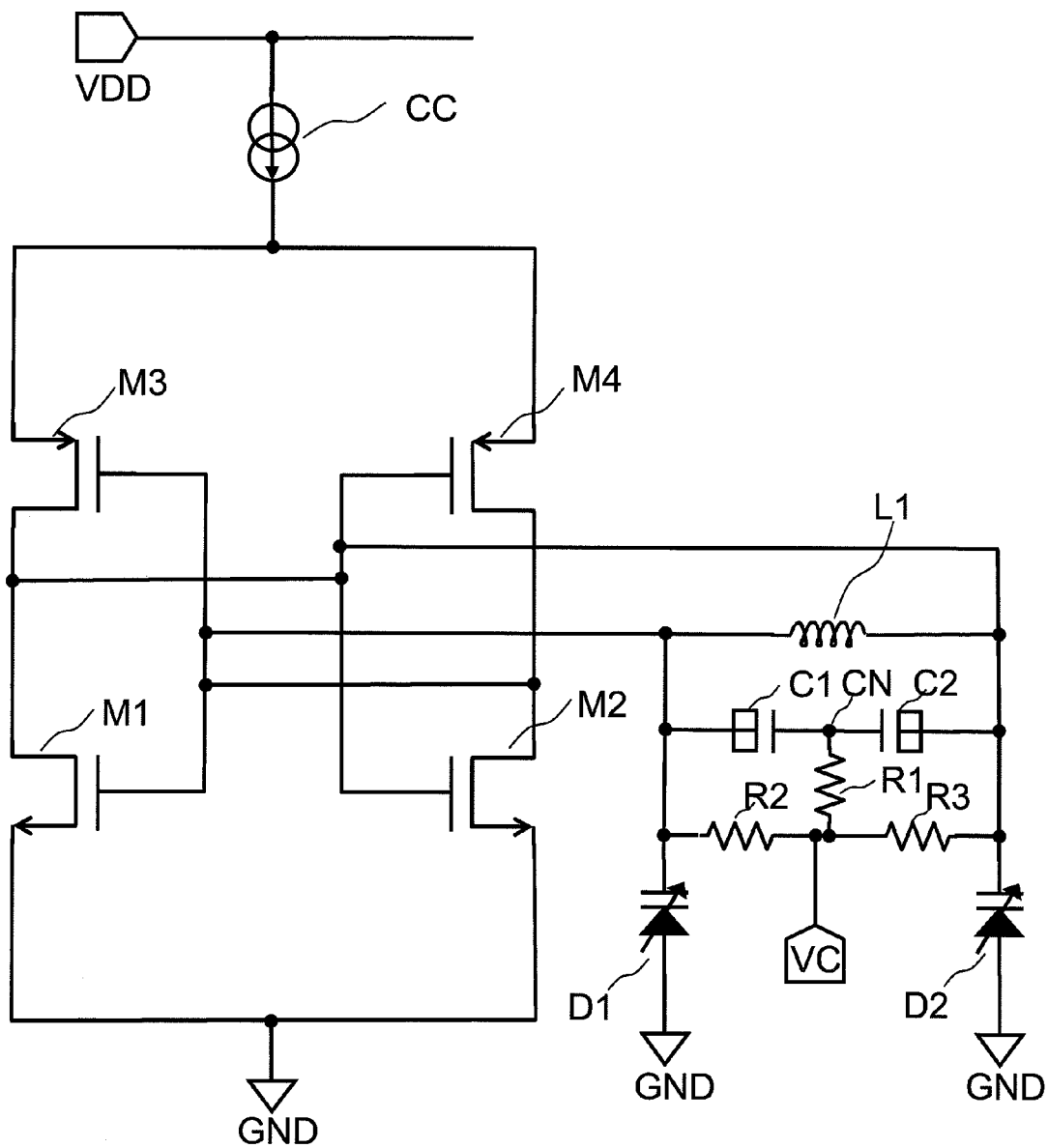
FIG. 1 is a block diagram of a voltage-controlled oscillator according to a first example of the present invention.
Figure 2:
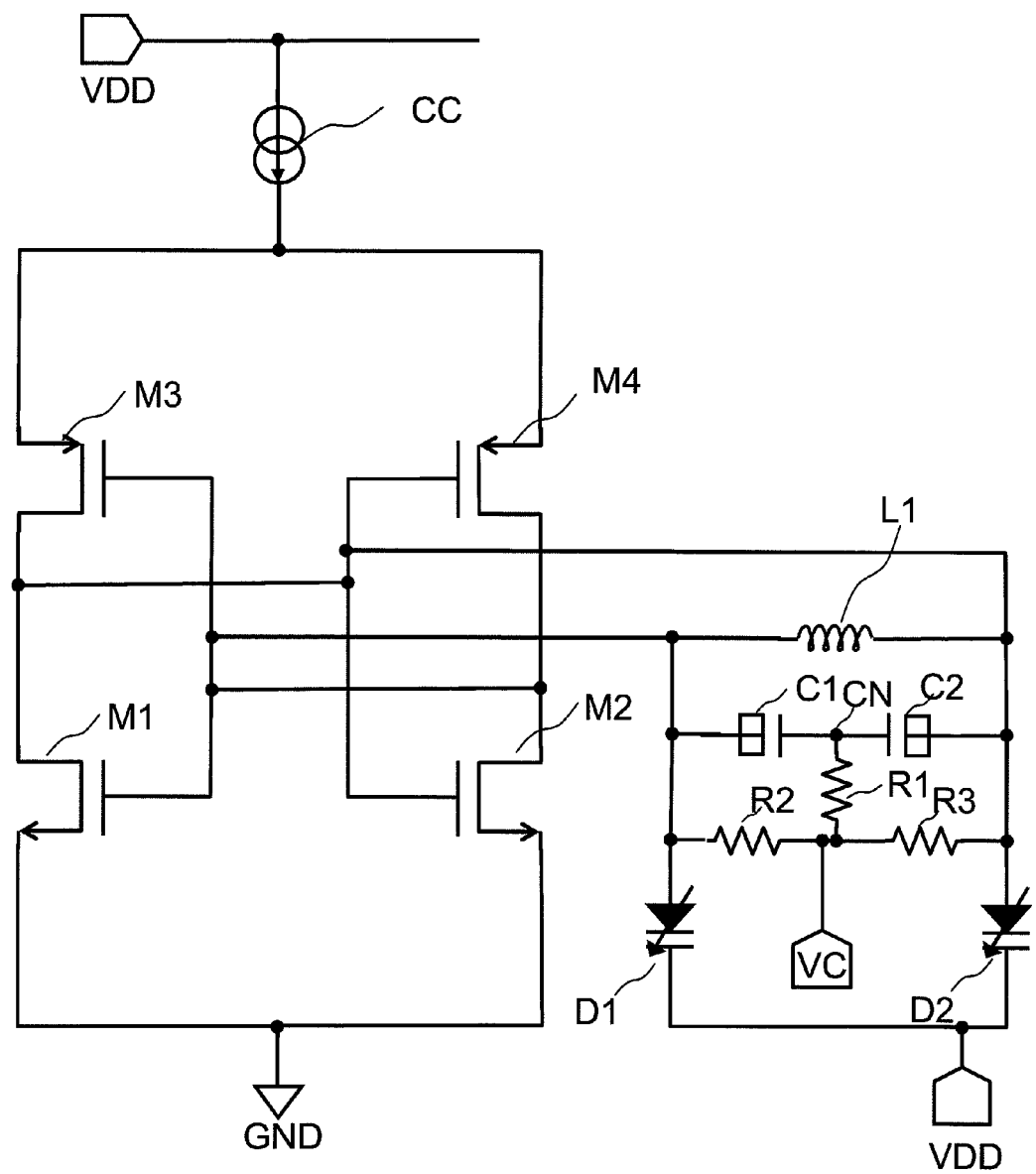
FIG. 2 is a block diagram of a voltage-controlled oscillator according to a first modification of the first example.
Figure 3:
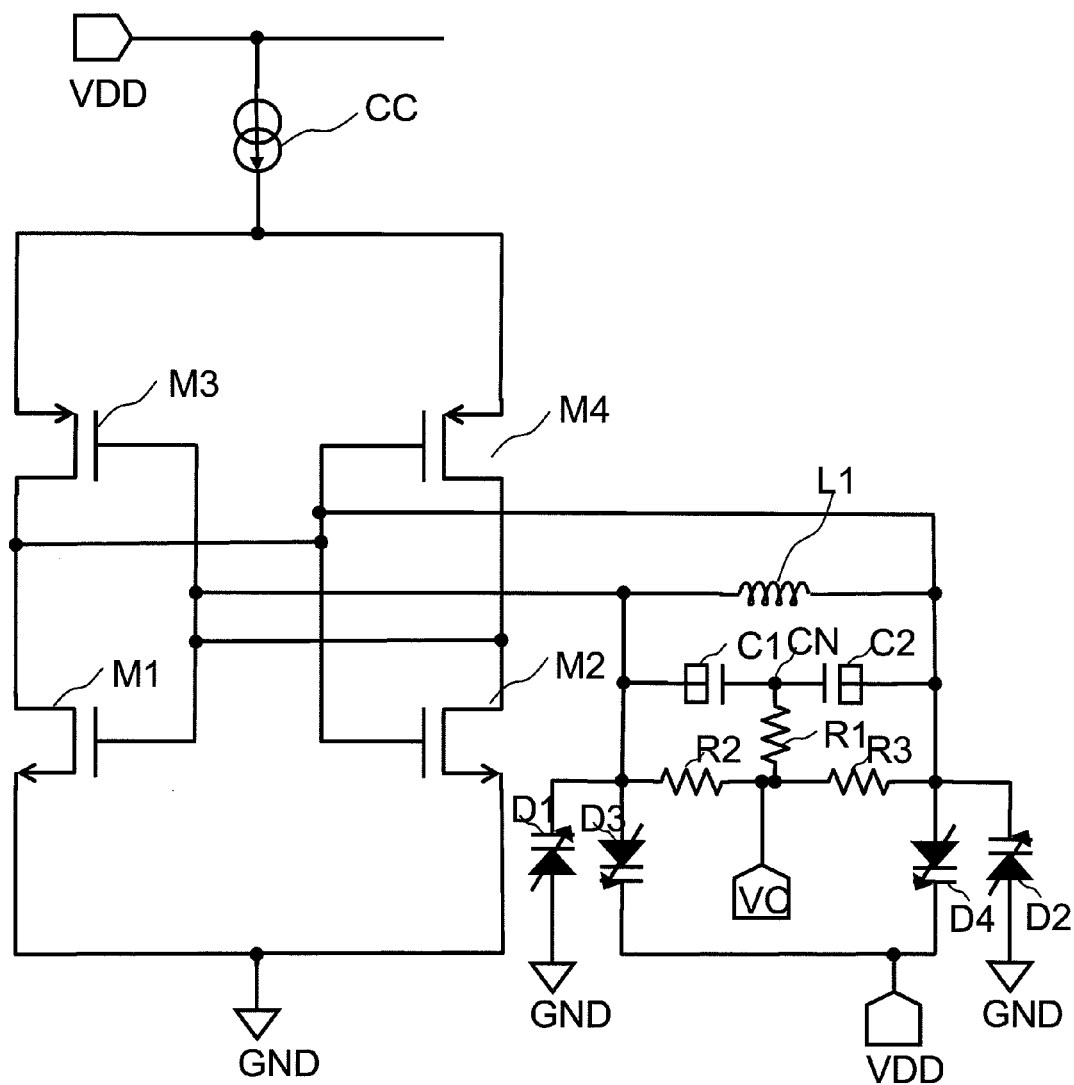
FIG. 3 is a block diagram of a voltage-controlled oscillator according to a second modification of the first example.

Further, as illustrated for example in FIGS. 1 to 3, the voltage-controlled oscillator 1 of a preferred mode includes: an inductor L1; first and second MOS varactors (C1 and C2) connected between respective ones of both ends of the inductor L1 and a common node CN; first and second varactor diodes (D1 and D2) connected between respective ones of both ends of the inductor L1 and a power supply (GND, VDD) so as to be reverse biased; a first resistor R1 connected between the common node CN and a voltage control terminal VC; and second and third resistors (R2 and R3) connected between respective ones of both ends of the inductor L1 and the voltage control terminal VC.

Further, as illustrated for example in FIG. 3, the voltage-controlled oscillator 1 of a preferred mode further includes third and fourth varactor diodes (D3 and D4) which, when the above-mentioned power supply (VDD, GND) is either one of a high-potential power supply VDD or a low-potential power supply GND, are connected between the other one of these power supplies and respective ones of both ends of the inductor L1 so as to be reverse biased.

Further, as illustrated in FIGS. 1 to 3, gate terminals of the first and second MOS varactors (C1 and C2) are connected to the common node CN.

Furthermore, as illustrated for example in FIGS. 1 to 3, the ends of the inductor are connected to respective ones of input and output terminals of the amplifier section. In the amplifier section as shown in FIGS. 1 to 3, an inverter constructed by MOS transistors M1, M3 supplied with current from a current source CC and an inverter constructed by MOS transistors M2, M4 supplied with current from the current source CC are connected in such a manner that the input terminal of one inverter is connected to the output terminal of the other inverter. The input and output terminals of these inverters serve as the input and output terminals of the amplifier and are connected to respective ones of both ends of the inductor L1.

Figure 12:
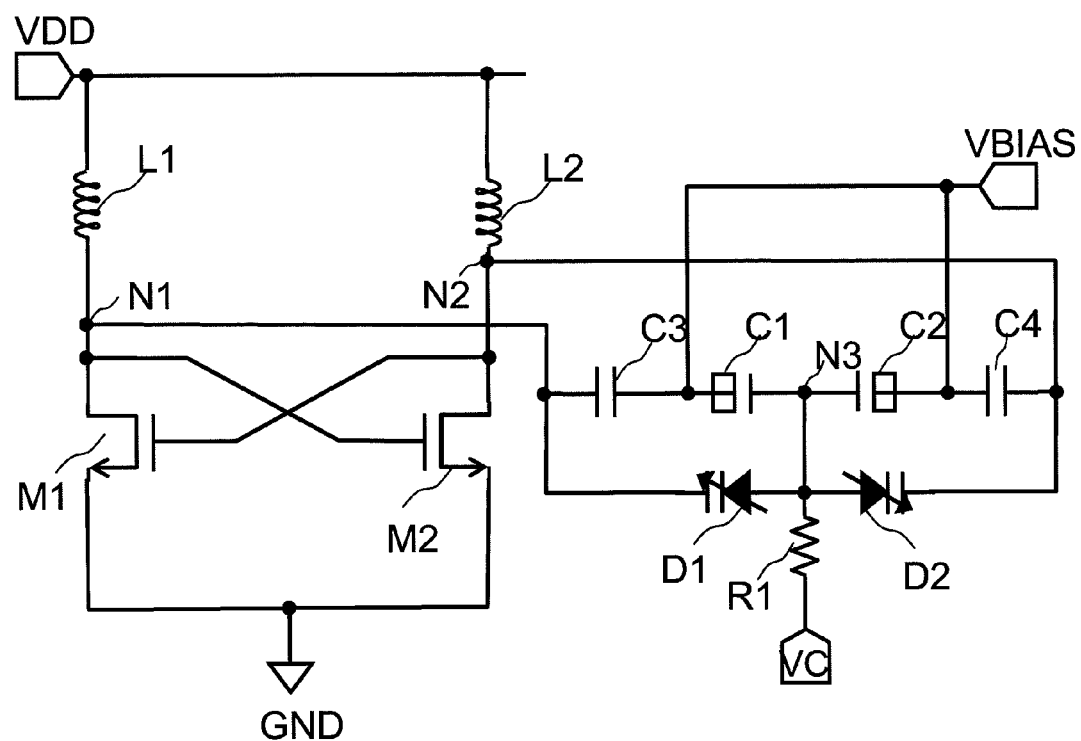
FIG. 12 is a block diagram of a voltage-controlled oscillator according to a second example of the present invention.
Figure 13:
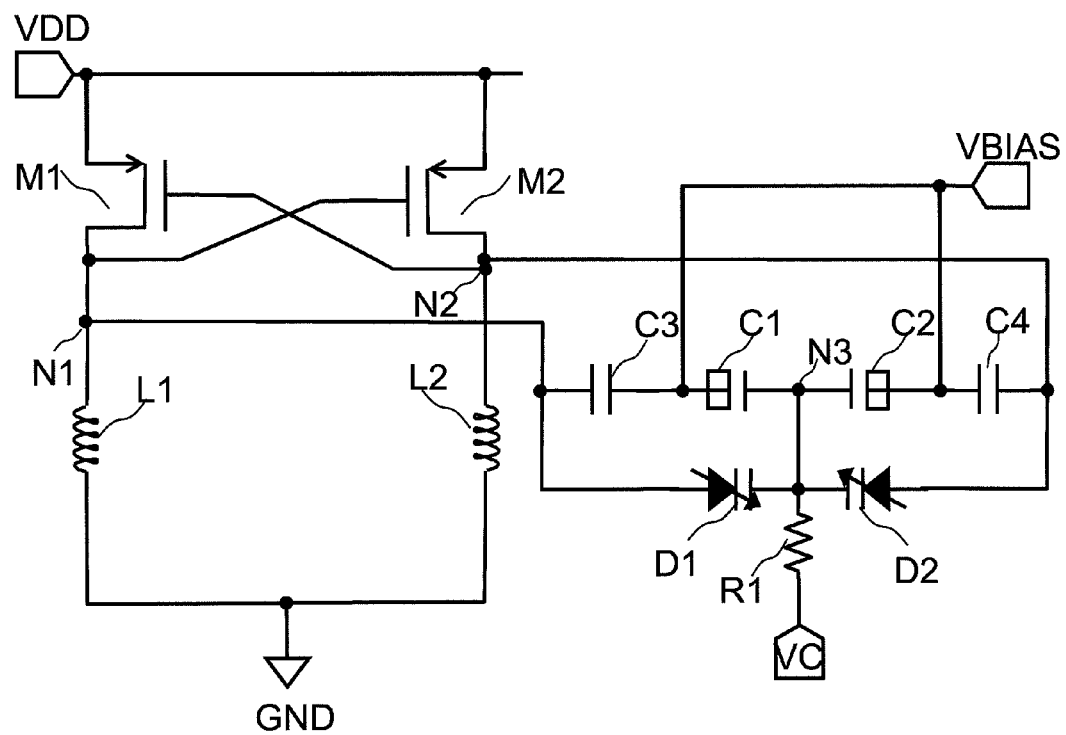
FIG. 13 is a block diagram of a voltage-controlled oscillator according to a third example of the present invention.

Further, as illustrated in FIGS. 12 and 13, the voltage-controlled oscillator further includes a first inductor L1 connected between a power supply VDD and a first node N1; a second inductor L2 connected between the power supply VDD and a second node N2; a first varactor diode D1 connected between a third node N3, which is connected to the voltage control terminal VC via a resistor R, and the first node N1 so as to be reverse biased; a second varactor diode D2 connected between the third node N3 and the second node N2 so as to be reverse biased; first and second MOS varactors (C1 and C2) each having a first end connected to the third node N3; a first fixed capacitor C3 connected between a second end of the first MOS varactor C1 and the first node N1; and a second fixed capacitor C4 connected between a second end of the second MOS varactor C2 and the second node N2.

Further, as illustrated in FIGS. 12 and 13, a fixed bias VBIAS is applied to the second end of each of the first and second MOS varactors. The fixed bias is applied in such a manner that the MOS varactors readily change their capacitance values owing to the voltage supplied from the voltage control terminal VC.

Gate terminals of the first and second MOS varactors (C1, C2) are connected to the third node N3, as shown in FIGS. 12 and 13.

Further, as illustrated in FIGS. 12 and 13, the first node N1 and the second node N2 are connected to the input and output terminals (drain and gate of transistors M1, M2), respectively, of the amplifier section (constructed by transistors M1, M2).

Furthermore, as illustrated in FIG. 12, a power supply to which the inductors (L1, L2) are connected is a high-potential power supply VDD, an anode and a cathode of the first varactor diode D1 are connected to the third node N3 and first node N1, respectively, and an anode and a cathode of the second varactor diode D2 are connected to the third node N3 and second node N2, respectively.

Alternatively, as illustrated in FIG. 13, a power supply to which the inductors (L1, L2) are connected is a low-potential power supply GND, an anode and a cathode of the first varactor diode D1 are connected to the first node N1 and third node N3, respectively, and an anode and a cathode of the second varactor diode D2 are connected to the second node N2 and third node N3, respectively. Examples of the preferred modes will now be described in detail with reference to the drawings.

First Example

FIG. 1 is a block diagram illustrating voltage-controlled oscillator 1 according to a first example. The voltage-controlled oscillator 1 shown in FIG. 1 is constituted by an amplifier section and a resonator section. The amplifier section includes a CMOS inverter constructed by a PMOS transistor M3 and an NMOS transistor M1, and a CMOS inverter constructed by a PMOS transistor M4 and an NMOS transistor M2. The sources of the PMOS transistors M3 and M4 are connected to current source circuit CC, which is connected to high-potential power supply VDD. The sources of the NMOS transistors M1 and M2 are connected to low-potential power supply GND. The two inverters are connected in such a manner that the input terminal of one is connected to the output terminal of the other. The input terminal and output terminal of the two inverters are connected to the resonator section as the input terminal and output terminal, respectively, of the amplifier section.

The resonator section includes inductor L1, first and second MOS varactors C1, C2, first and second varactor diodes D1, D2 and first to third resistors R1 to R3. The ends of the inductor L1 are connected to respective ones of the input and output terminals of the amplifier section. Further, the cathode of first varactor diode D1 and the cathode of second varactor diode D2 are connected to respective ones of the two ends of inductor L1. The anodes of the first varactor diode D1 and second varactor diode D2 are connected to low-potential power-supply terminals GND. Source-drain terminals of the first MOS varactor C1 and second MOS varactor C2 are connected to respective ones of the two ends of the inductor L1. Gate terminals of the first MOS varactor C1 and second MOS varactor C2 are connected to common node CN, and the common node CN is connected to voltage control terminal VC, which is a tuning terminal, via a first resistor R1. The cathodes of the first and second varactor diodes D1 and D2 are connected to the voltage control terminal VC via second and third resistors R2 and R3, respectively.

By virtue of the arrangement described above, the resonator section functions as a resonating circuit in which the first and second MOS varactors C1, C2 and the first and second varactor diodes D1, D2 are connected in parallel with the inductor L1. Further, the voltage control terminal VC is connected to the gate terminals of the first and second MOS varactors C1, C2 and to the cathodes of the first and second varactor diodes D1, D2 via the first to third resistors R1 to R3.

When the voltage of the voltage control terminal VC changes, therefore, the capacitances of the first and second MOS varactors C1, C2 and first and second varactor diodes D1, D2 change together. It should be noted that in FIG. 1, the first and second MOS varactors C1, C2 each have their drain and source short-circuited and function as two-terminal variable capacitance elements in which one terminal is the gate terminal and the other terminal is the source-drain terminal.

FIG. 2 is a block diagram of a voltage-controlled oscillator according to a first modification of the first example. In FIG. 1, the first and second varactor diodes are connected between the low-potential power supply GND and to respective ones of the two ends of inductor L1. The first modification shown in FIG. 2 differs in that the first and second varactor diodes are connected between the high-potential power supply VDD and to respective ones of the two ends of inductor L1. The varactor diodes are connected in such a manner that they are reverse biased in terms of the their orientation in a manner similar to that of FIG. 1. That is, the anodes of the varactor diodes are connected to respective ones of the two ends of inductor L1 and the cathodes are connected to the high-potential power supply VDD. This modification is the same as the first example in other respects.

FIG. 3 is a block diagram of a voltage-controlled oscillator according to a second modification of the first example. Here third and fourth varactor diodes D3 and D4 are provided in addition to the first and second varactor diodes D1 and D2. The third and fourth varactor diodes D3 and D4 are connected between both ends of the inductor L1 and the high-potential power supply VDD, and the first and second varactor diodes D1 and D2 are connected between the both ends of the inductor L1 and the low-potential power supply GND. The orientation of the connection of each of the first to fourth varactor diodes D1-D4 is the reverse-bias orientation.

Each of the oscillating circuits shown in FIGS. 1 to 3 generates a resonance-frequency AC signal when an electrical stimulus is applied to the resonator section. However, since the resonance phenomenon is attenuated and ceases owing to the parasitic resistance of the resonator section, such loss is made up for by a negative resistance produced by the amplifier section, which is constructed for positive feedback, and a steady AC signal is obtained as a result. Although the voltage-controlled oscillator is a circuit that controls oscillation frequency by an applied voltage, it is possible to obtain the controlled oscillation frequency by varying the value of C, namely the varactor capacitance, in the resonance frequency $f=1/(2\pi\sqrt{LC})$. Although the amplifier section in each of FIGS. 1 to 3 is composed of MOS transistors, it can also be constructed by bipolar transistors. The amplifier section may be any circuit that will maintain the resonance produced by the resonator section.

Figure 4:
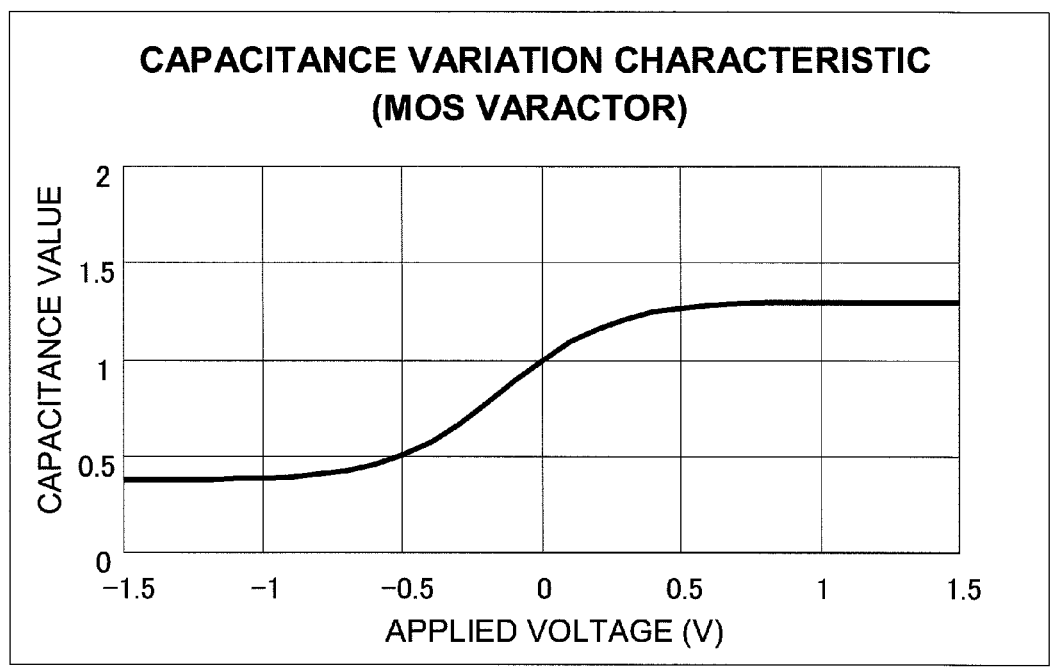
FIG. 4 is a characteristic of a change in capacitance value with respect to applied voltage of a MOS varactor.
Figure 5:
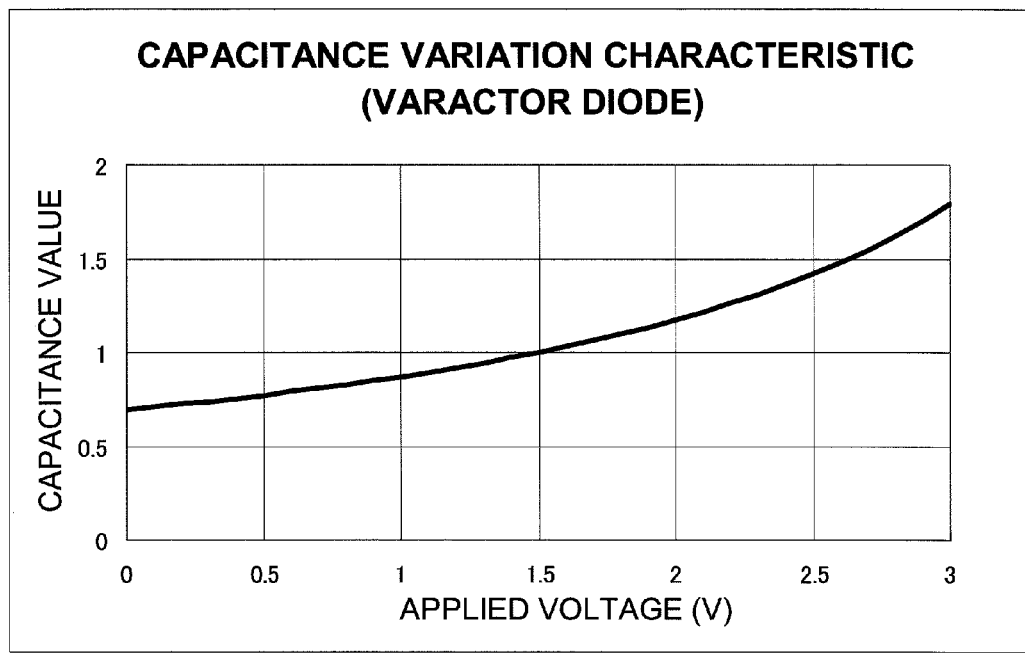
FIG. 5 is a characteristic of a change in capacitance value with respect to applied voltage of a varactor diode.

Next, reference will be had to FIGS. 4 and 5 to describe the difference between characteristics of a change in capacitance value with respect to applied voltage of a MOS varactor and varactor diode, which are variable capacitance elements.

FIG. 4 is a characteristic of a change in capacitance value with respect to applied voltage of a MOS varactor. Control of the capacitance value of a MOS varactor is implemented by the relative potentials of the gate terminal and source-drain terminal, and use is possible with substantially the same characteristics regardless of whether application of the voltage is to the gate terminal or source-drain terminal. In the case of a MOS varactor, usually the source and drain are short-circuited and the capacitance between the short-circuited source-drain and the gate terminal is used as a variable capacitance. As for the directions of application of voltage for varying capacitance, there are two directions, namely the plus and minus directions, with the threshold-value voltage of the MOS transistor serving as the reference.

As will be understood from FIG. 4, the capacitance value changes suddenly when the applied voltage is changed to a value in the vicinity of the threshold value (0 V) of the MOS transistor. However, as the applied voltage departs from the threshold value of the MOS transistor, the characteristic of the change in capacitance becomes much more gentle. It can also be understood from FIG. 4 that when the applied voltage is less than −1 V and equal to or greater than 1 V, there is almost no change in the capacitance value even if the applied voltage is varied.

FIG. 5 is a characteristic of a change in capacitance value with respect to applied voltage of a varactor diode. Control of the capacitance value of a varactor diode is implemented by applying a reverse bias to the anode terminal and cathode terminal and controlling the thickness of a depletion layer produced by the reverse bias as the PN junction. Application of the voltage for controlling the capacitance value may be to the anode terminal or cathode terminal so long as a reverse bias is applied. It should be noted that in order to control and use the depletion layer produced by reverse bias at the PN junction, the direction of the voltage application is only the reverse direction. In the case where voltage is applied to the cathode, since the anode is connected to the low-potential power supply (0 V, which is ground) and serves as the reference, the capacitance increases as the cathode voltage is lowered from the voltage of the high-potential power supply to the voltage (0 V) of the low-potential power supply. That is, the capacitance value has a negative slope with respect to the applied voltage. On the other hand, in the case where voltage is applied to the anode, since the cathode is connected to the high-potential power supply and serves as the reference, the capacitance value increases as the anode voltage is raised from 0 V to the voltage of the high-potential power supply. That is, the capacitance value has a positive slope with respect to the applied voltage.

As will be understood from FIG. 5, the change in the capacitance value with respect to the applied voltage is comparatively linear; if the applied voltage is changed, then the capacitance value varies with this change. However, if this is standardized and compared with the rate of change in the capacitance of a MOS varactor, it will be seen that the varactor diode exhibits a rate of change in capacitance that is smaller than that of a MOS varactor particularly in the vicinity of the threshold value of the MOS varactor. That is, with a MOS varactor, a large rate of change in capacitance is obtained particularly in the vicinity of the threshold value of the MOS varactor, but there are instances where the modulation sensitivity is too high. The rate of change in capacitance declines rapidly as the voltage departs from the threshold value. With a varactor diode, on the other hand, a linear rate of change in capacitance is obtained over a broader range in comparison with the MOS varactor, but the rate of change in capacitance is low. Consequently, a broad control frequency range is not obtained. Thus, a MOS varactor and a varactor diode exhibit applied voltage vs. capacitance characteristics that differ from each other.

In the first example, the MOS varactors and varactor diodes are connected in parallel and the capacitance values of the MOS varactors and varactor diodes are controlled simultaneously. Although the MOS varactors and varactor diodes have mutually different applied voltage vs. capacitance characteristics, as mentioned above, in accordance with the first example, the advantages of both can be exploited while compensation can be made for the disadvantages.

Specifically, slow-down of the change in frequency in regions remote from the reference voltage, which occurs when the MOS varactors are used, is compensated for by the varactor diodes. As a result, the linearity of the change in frequency can be improved over a broad range of control voltages.

Further, the change in capacitance in a case where only MOS varactors are used is such that modulation sensitivity is too high in the vicinity of the threshold value. However, this can be mitigated by making joint use of varactor diodes. The degree of such mitigation can be controlled by changing the capacitance ratio between the MOS varactors and varactor diodes.

Furthermore, the change in capacitance in a case where only MOS varactors are used is such that the frequency range from maximum oscillation frequency to minimum oscillation frequency is too broad and it may become difficult to assure normal operation over the full range in a frequency divider located downstream. By making joint use of the varactor diodes, however, this difficulty can be alleviated.

Figure 6:
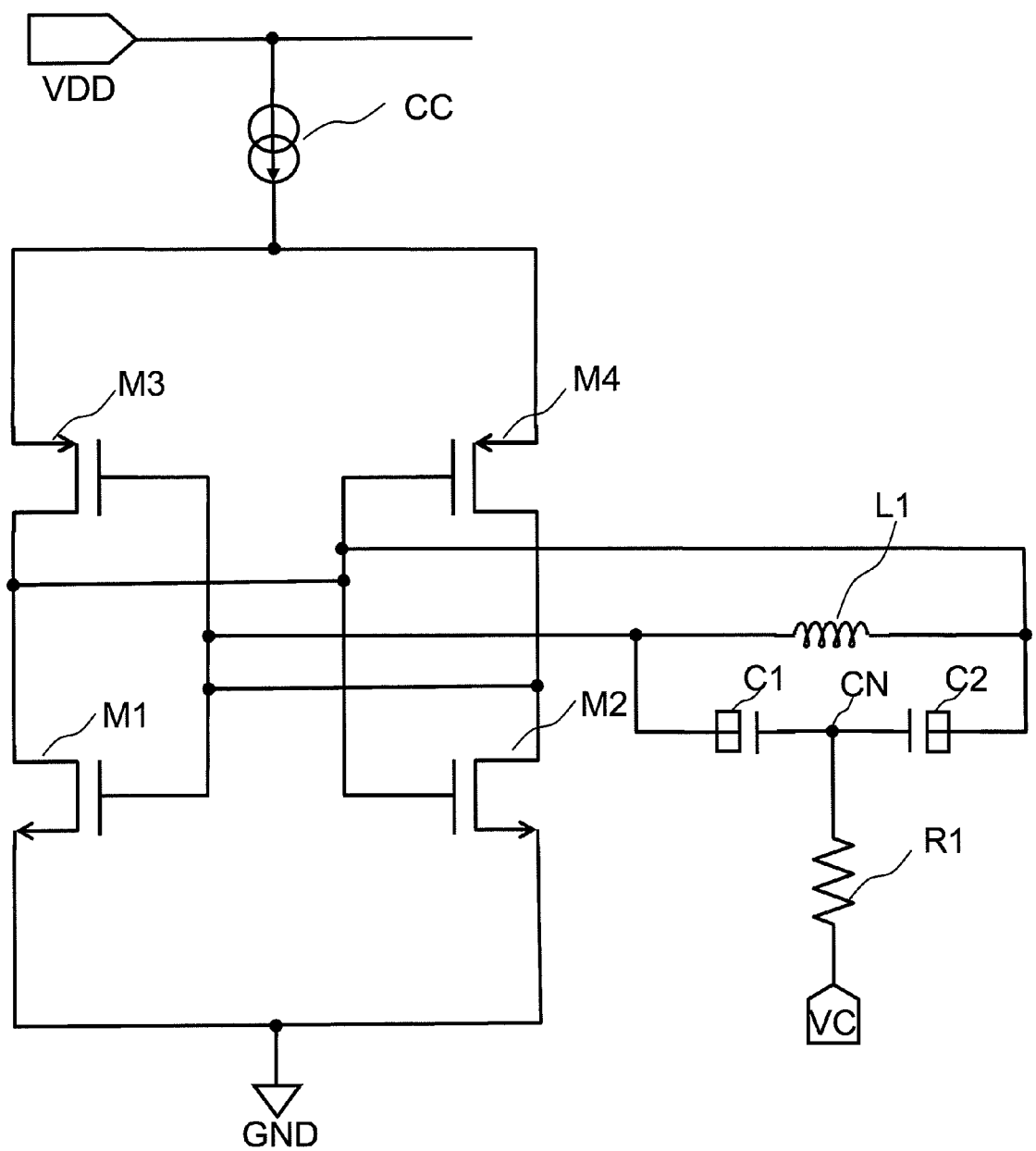
FIG. 6 is a block diagram of a voltage-controlled oscillator according to a first comparative example.
Figure 7:
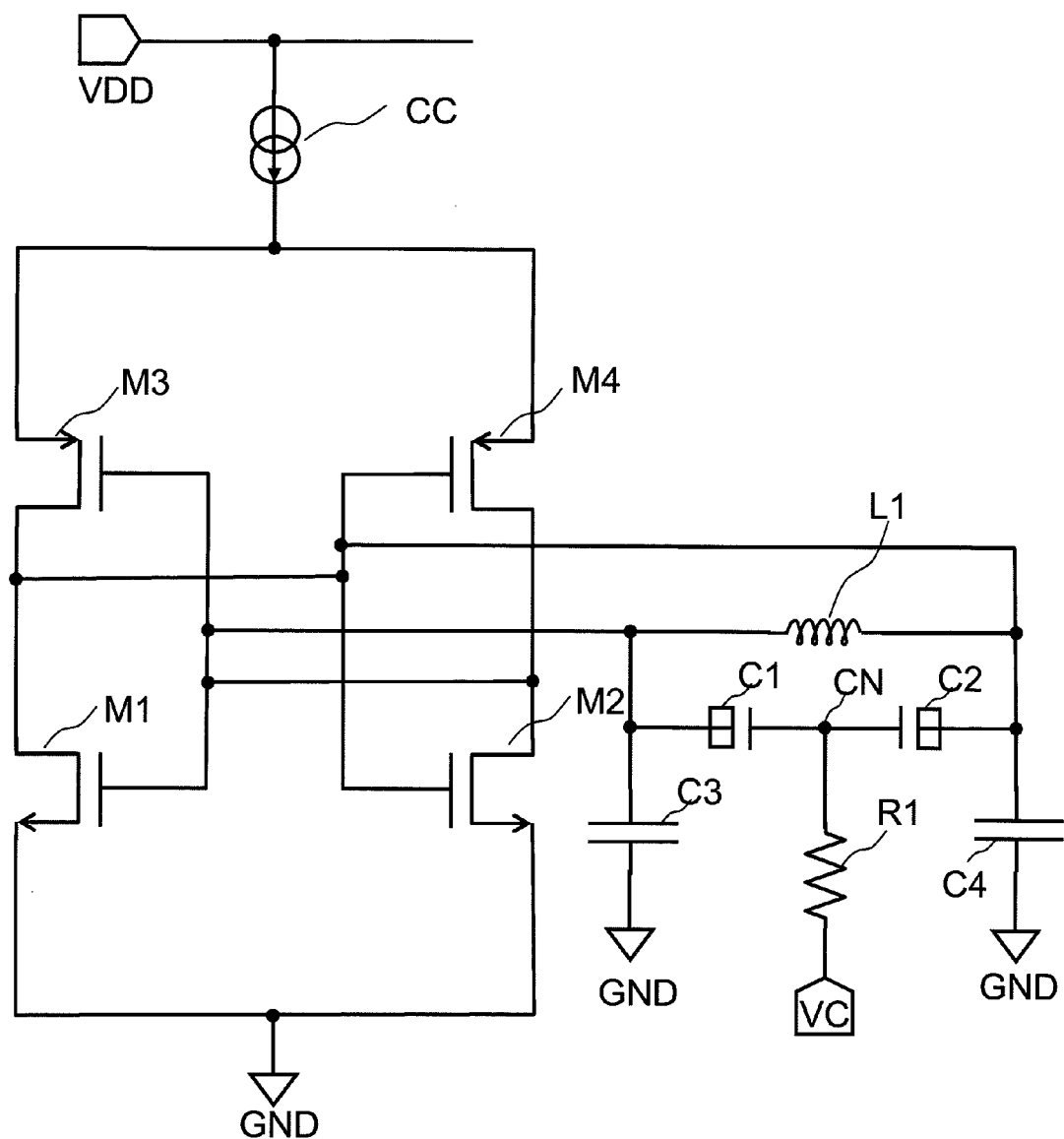
FIG. 7 is a block diagram of a voltage-controlled oscillator according to a second comparative example.
Figure 8:
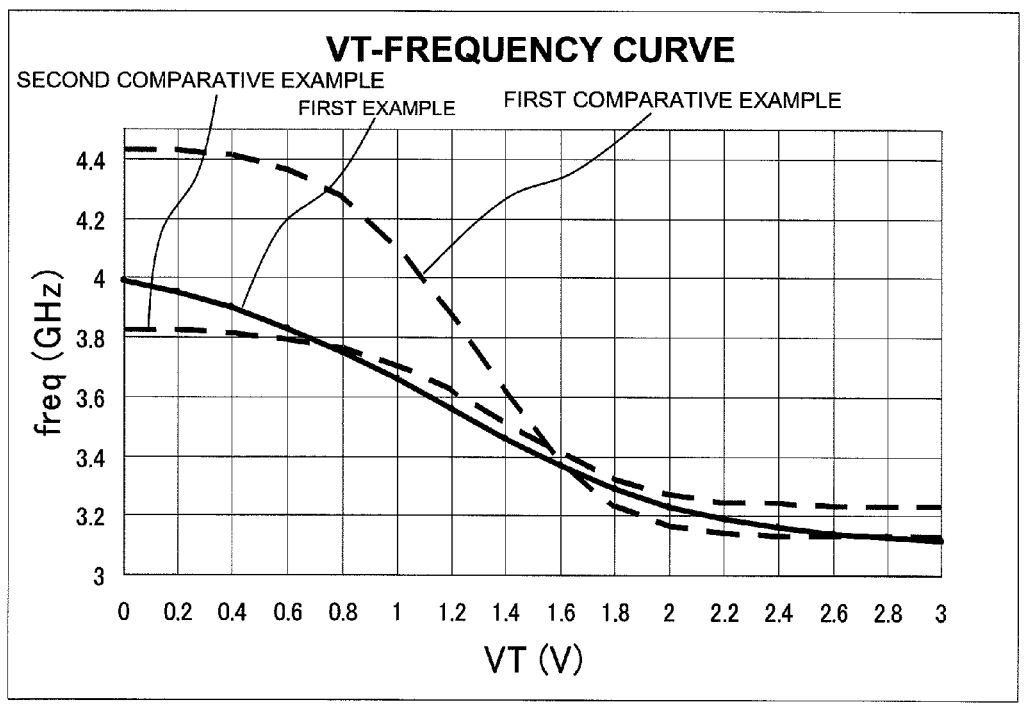
FIG. 8 is a diagram comparing a control voltage vs. oscillation frequency characteristic of the first example with those of the first and second comparative examples.

FIG. 8 is a diagram comparing a control voltage vs. oscillation frequency characteristic of the first example with those of first and second comparative examples. The configuration of a voltage-controlled oscillator 101 according to a first comparative example is shown in FIG. 6, and the configuration of a voltage-controlled oscillator 102 according to a second comparative example is shown in FIG. 7. The voltage-controlled oscillator 101 of FIG. 6, which has only the MOS varactors C1, C2 as the variable capacitance elements, is obtained by removing the varactor diodes D1, D2 and the resistors R2, R3, which are connected between the cathodes of the varactor diodes D1, D2 and the voltage control terminal VC, from the voltage-controlled oscillator of FIG. 1.

The voltage-controlled oscillator 102 of FIG. 7 is obtained by additionally providing the voltage-controlled oscillator 101 of FIG. 6 with fixed capacitors C3, C4 between the inductor L1 and the low-potential power supply GND, and reducing the modulation sensitivity in the vicinity of the threshold value of the MOS varactors C1, C2.

In the first comparative example shown in FIG. 8, modulation sensitivity is too high when control voltage VT is in the vicinity of 1.2 V. In the second comparative example, the fixed capacitors have been added on and therefore the modulation sensitivity is diminished overall. In both of these first and second comparative examples, there is almost no change in oscillation frequency even if the control voltage is changed when the control voltage is less than 0.4 V and equal to or greater than 2.2 V. By contrast, in the first example, modulation sensitivity is lessened when the control voltage is in the vicinity of 1.2 V, and oscillation frequency varies with the control voltage over the full range of 0 to 3 V.

Figure 9:
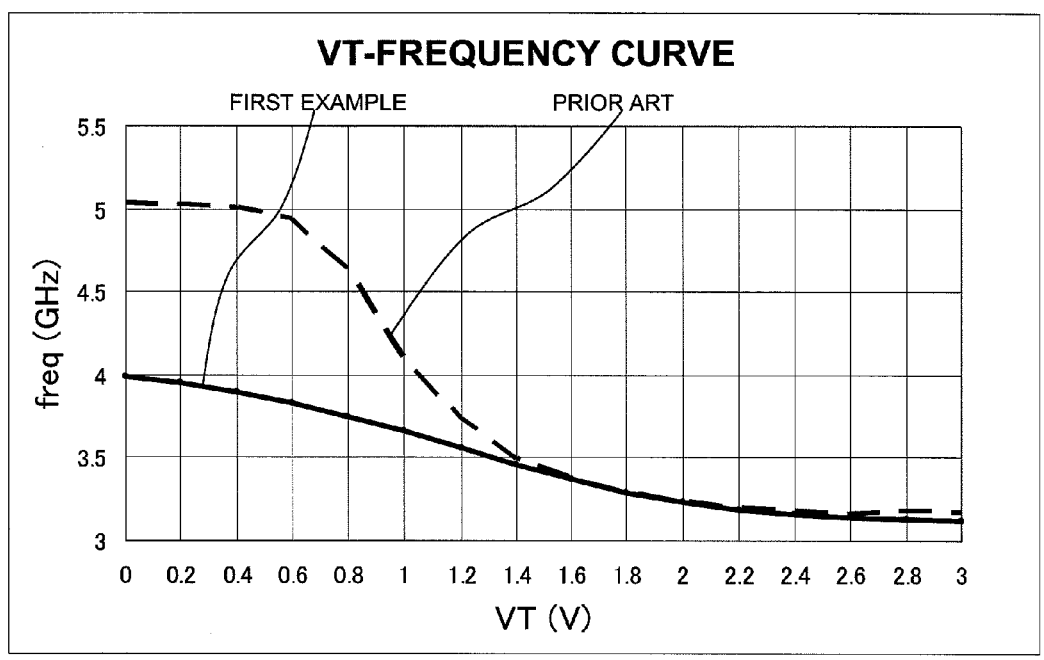
FIG. 9 is a diagram comparing a control voltage vs. oscillation frequency characteristic of a voltage-controlled oscillator according to the first example with that of the voltage-controlled oscillator according to the prior art described in Patent Document 1.

FIG. 9 is a diagram comparing a control voltage vs. oscillation frequency characteristic of the voltage-controlled oscillator described in Patent Document 1 with that of the voltage-controlled oscillator 1 according to the first example. As already described, the voltage-controlled oscillator set forth in Patent Document 1 includes the varactor diodes and MOSFETs connected in parallel, and the MOSFETs are used as variable capacitors. Further, as set forth in paragraph [0018] of Patent Document 1, the capacitance of the varactor diodes is assumed to be so small as to be negligible in comparison with the overall capacitance. Basically, therefore, the characteristic is similar to that of the first comparative example shown in FIG. 6. Accordingly, in a manner similar to that of the first comparative example, there is a region in which modulation sensitivity is too high at a specific control voltage, and there are regions in which there is almost no change in oscillation frequency, even if the control voltage is varied, when the control voltage departs from the specific control voltage.

Figure 10:
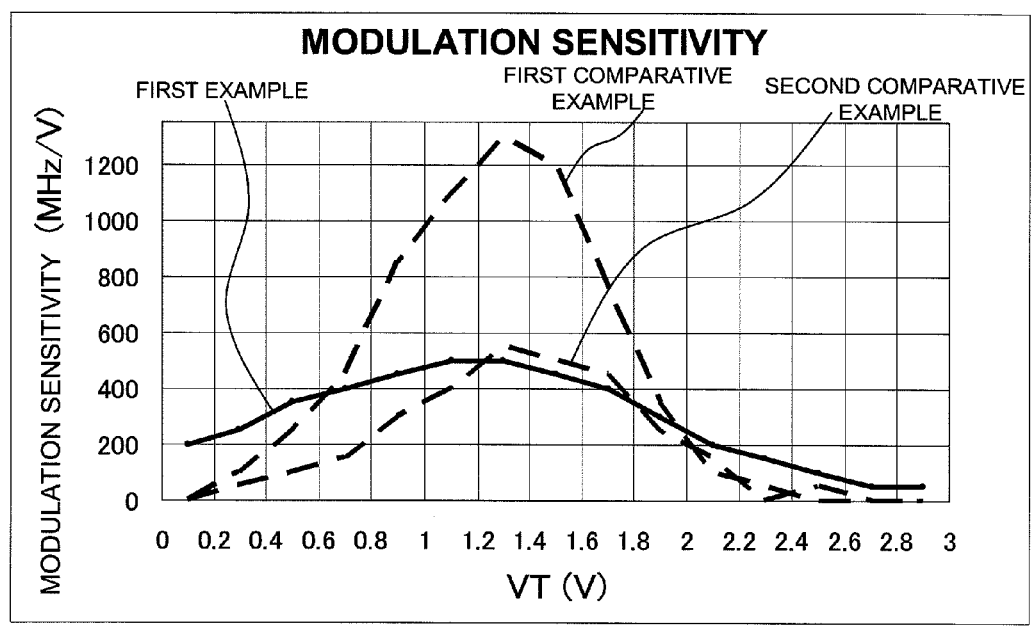
FIG. 10 is a diagram comparing a control voltage vs. modulation sensitivity characteristic according to the first example with those of the first and second comparative examples.

FIG. 10 is a diagram comparing a control voltage vs. modulation sensitivity characteristic according to the first example with those of the first and second comparative examples. In accordance with the first example, a region in which modulation sensitivity is too high, as in the first comparative example, does not exist, and a region in which a moderate modulation sensitivity is obtained is broader in comparison with the first and second comparative examples. The modulation sensitivity sought for a voltage-controlled oscillator differs depending upon the phase noise required. In an IC for GPS reception, for example, there are cases where it is desired to suppress modulation sensitivity to 150 to 600 MHz. If the controllable voltage range over which the desired modulation sensitivity is obtained is found in such cases, the range will be 0.4 to 2.0 V for the first comparative example, 0.7 to 2.1 V for the second comparative example, and 0 to 2.4 V for the first example, in accordance with FIG. 10. That is, in accordance with the first example, the desired modulation sensitivity is obtained in a region broader than in the first and second comparative examples.

Figure 11:
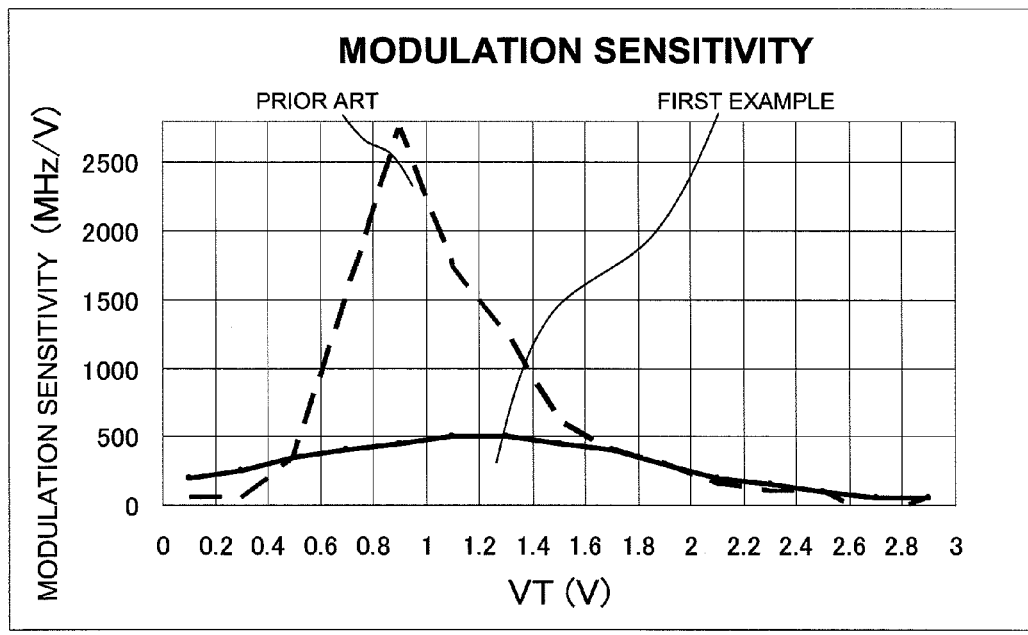
FIG. 11 is a diagram comparing a control voltage vs. modulation sensitivity characteristic of a voltage-controlled oscillator according to the first example with that of the voltage-controlled oscillator according to the prior art described in Patent Document 1.

FIG. 11 is a diagram comparing a control voltage vs. modulation sensitivity characteristic of a voltage-controlled oscillator according to the first example with that of the voltage-controlled oscillator according to the prior art described in Patent Document 1. The prior art has a characteristic basically similar to that of the first comparative example shown in FIG. 10. In accordance with the first example, however, a control voltage vs. modulation sensitivity characteristic that is superior to the prior art is obtained.

Second Example

FIG. 12 is a block diagram of the voltage-controlled oscillator 1 according to a second example. The voltage-controlled oscillator 1 shown in FIG. 12 is one used often under conditions where the power-supply voltage is low or in bipolar circuits. Since the voltage of the resonator section is near the high-potential power-supply voltage, the arrangement of this voltage-controlled oscillator differs slightly from that of the voltage-controlled oscillator of the first example. The voltage-controlled oscillator 1 shown in FIG. 12 is constituted by the amplifier section and resonator section. The amplifier section includes NMOS transistor M1 and NMOS transistor M2, in which the drain of the NMOS transistor M1 and the gate of the NMOS transistor M2 are connected to first node N1. Further, the drain of NMOS transistor M2 and the gate of NMOS transistor M1 are connected to second node N2. The first and second nodes N1, N2 are the input and output terminals of the amplifier section and are connected to the resonator section. The sources of the NMOS transistors M1, M2 are both connected to the low-potential power supply GND. It should be noted that the NMOS transistors M1, M2 can be replaced respectively by an NPN bipolar transistor having a collector connected to the first node N1, a base connected to the second node N2 and an emitter connected to the low-potential power supply GND, and an NPN bipolar transistor having a collector connected to the second node N2, a base connected to the first node N1 and an emitter connected to the low-potential power supply GND.

The resonator section includes first and second inductors L1, L2; first and second MOS varactors C1, C2; first and second varactor diodes D1, D2; resistor R1; and first and second fixed capacitors C3, C4. The inductor L1 is connected between the power supply VDD and the first node N1, and the inductor L2 is connected between the high-potential power supply VDD and the second node N2. Cathodes of the first and second varactor diodes D1 and D2 are connected to the first and second nodes N1 and N2, respectively. The anodes of the first and second varactor diodes D1, D2 are connected to the third node N3, and the third node N3 is connected to the voltage control terminal VC via the resistor R1. Furthermore, the gate terminals of the first and second MOS varactors C1, C2 are connected to the third node N3. Fixed bias voltage VBIAS is applied to the source-drain terminals of the first and second MOS varactors C1, C2. The first and second fixed capacitors C3, C4 are connected between the source-drain terminals of the first and second MOS varactors C1, C2 and the first and second nodes N1, N2. The fixed capacitors C3, C4 are provided in order to block DC voltage, and the fixed bias voltage VBIAS, which serves as the reference potential of the control voltage of the MOS varactors, is externally applied to the points of connection between the fixed capacitors C3, C4 and the MOS varactors C1, C2. A voltage that is midway between the high-potential power supply VDD and the low-potential power supply (GND) is preferred as the voltage of VBIAS.

By virtue of the above-described arrangement as well, the MOS varactors and varactor diodes are connected in parallel, and the MOS varactors and varactor diodes are controlled simultaneously by the voltage supplied from the voltage control terminal VC. As a result, a voltage-controlled oscillator having an excellent characteristic similar to that of the first example is obtained.

Third Example

FIG. 13 is a block diagram of the voltage-controlled oscillator 1 according to a third example. The second example provides a voltage-controlled oscillator suited to a case where the voltage of the resonator section is close to the high-potential power supply VDD. The third example, however, provides an arrangement for the voltage-controlled oscillator suited to a case where the voltage of the resonator section is close to the low-potential power supply (ground) GND. In the second example, the amplifier section is constituted by NMOS transistors the sources of which are connected to the low-potential power supply. On the other hand, the third example differs in that the amplifier section is constituted by PMOS transistors the sources of which are connected to the high-potential power supply VDD. Further, the first and second inductors L1 and L2 are connected between the first and second nodes N1 and N2, respectively, and the low-potential power supply GND. Further, this example is the same the second example of FIG. 12 except for the fact that the orientation of connection of the first and second varactor diodes D1, D2 is such that the first and second nodes N1, N2 are connected to the anodes and the third node N3 is connected to the cathodes. As a result, a voltage-controlled oscillator having an excellent characteristic similar to that of the first example is obtained. Further, the PMOS transistors of the amplifier section can also be replaced by PNP bipolar transistors.

It should be noted that although an NMOS varactor in which an NMOS transistor structure is used in the varactor and a PMOS varactor in which a PMOS transistor structure is used in the varactor are considered as the MOS varactor, either structure may be used as the MOS varactor as necessary. Further, there are cases where the varactor diodes and MOS varactors connected in parallel are such that the characteristic of the change in capacitance with respect to applied voltage is reversed by the orientation of the connections.

However, when there is a change in the direction in which the varactor-diode capacitance increases when the applied voltage is changed, it is preferred that the MOS varactors also be connected in an orientation in which the capacitance increases.

In the present disclosure, various modes are possible which includes the following, but not restrictive thereto.

(Mode 1): A voltage-controlled oscillator as set forth as the first aspect.

(Mode 2): In the voltage-controlled oscillator according to mode 1, wherein said plurality of types of variable capacitance elements comprise MOS varactors and varactor diodes.

(Mode 3): In the voltage-controlled oscillator according to mode 2, further comprising:
an inductor;
a first MOS varactor and a second MOS varactor connected between respective ones of two ends of said inductor and a common node;
a first varactor diode and a second varactor diode connected between respective ones of two ends of said inductor and a power supply so as to be reverse biased;
a first resistor R1 connected between the common node and a voltage control terminal; and
second and third resistors connected between respective ones of two ends of said inductor and the voltage control terminal.

(Mode 4): In the voltage-controlled oscillator according to mode 3, further comprising third and fourth varactor diodes which, when the power supply is one of either a high-potential power supply or a low-potential power supply, are connected between the other one of these power supplies and respective ones of two ends of said inductor so as to be reverse biased.

(Mode 5): In the voltage-controlled oscillator according to mode 3 or 4, wherein gate terminals of said first and second MOS varactors are connected to the common node.

(Mode 6): In the voltage-controlled oscillator according to any one of modes 3 to 5, wherein said amplifier section comprises a first and a second input/output terminals, and wherein the ends of said inductor are connected to respective ones of said first and second input/output terminals.

(Mode 7): In the voltage-controlled oscillator according to mode 2, further comprising:
a first inductance connected between the power supply and a first node;
a second inductance connected between the power supply and a second node;
a first varactor diode connected between a third node, which is connected to the voltage control terminal via a resistor, and the first node so as to be reverse biased;
a second varactor diode connected between the third node and the second node so as to be reverse biased;
first and second MOS varactors each having a first end connected to the third node;
a first fixed capacitor connected between a second end of said first MOS varactor and the first node; and
a second fixed capacitor connected between a second end of said second MOS varactor and the second node.

(Mode 8): In the voltage-controlled oscillator according to mode 7, wherein a fixed bias is applied to the second end of each of said first and second MOS varactors.

(Mode 9): In the voltage-controlled oscillator according to mode 7 or 8, wherein gate terminals of said first and second MOS varactors are connected to the third node.

(Mode 10): In the voltage-controlled oscillator according to modes 7 to 9, wherein said amplifier section comprises a first and a second input/output terminals, and wherein the first node and the second node are connected to said first and second input/output terminals, respectively.

(Mode 11): In the voltage-controlled oscillator according to any one of modes 7 to 10, wherein the power supply is a high-potential power supply, an anode and a cathode of said first varactor diode are connected to the third node and first node, respectively, and an anode and a cathode of said second varactor diode are connected to the third node and second node, respectively.

(Mode 12): In the voltage-controlled oscillator according to any one of modes 7 to 10, wherein the power supply is a low-potential power supply, an anode and a cathode of said first varactor diode are connected to the first node and third node, respectively, and an anode and a cathode of said second varactor diode are connected to the second node and third node, respectively.

(Mode 13): A voltage-controlled oscillator as set forth as the second aspect.

(Mode 14): In the voltage-controlled oscillator according to mode 13, further comprising third and fourth varactor diodes which, when the power supply is one of either a high-potential power supply or a low-potential power supply, are connected between the other one of these power supplies and respective ones of two ends of said inductor so as to be reverse biased.

(Mode 15): In the voltage-controlled oscillator according to mode 13 or 14, wherein gate terminals of said first and second MOS varactors are connected to the common node.

(Mode 16): In the voltage-controlled oscillator according to any one of modes 13 to 15, wherein said amplifier section comprises first and second input/output terminals, and wherein the ends of said inductor are connected to respective ones of input and output terminals of said amplifier section.

(Mode 17): A voltage-controlled oscillator as set forth as the third aspect.

(Mode 18): In the voltage-controlled oscillator according to mode 17, wherein a fixed bias is applied to the second end of each of said first and second MOS varactors.

(Mode 19): In the voltage-controlled oscillator according to mode 17 or 18, wherein gate terminals of said first and second MOS varactors are connected to the third node.

(Mode 20): In the voltage-controlled oscillator according to modes 17 to 19, wherein said amplifier section comprises first and second input/output terminals, and wherein the first node and the second node are connected to said first and second input/output terminals, respectively.

(Mode 21): In the voltage-controlled oscillator according to any one of modes 17 to 20, wherein the power supply is a high-potential power supply, an anode and a cathode of said first varactor diode are connected to the third node and first node, respectively, and an anode and a cathode of said second varactor diode are connected to the third node and second node, respectively.

(Mode 22): In the voltage-controlled oscillator according to any one of modes 17 to 20, wherein the power supply is a low-potential power supply, an anode and a cathode of said first varactor diode are connected to the first node and third node, respectively, and an anode and a cathode of said second varactor diode are connected to the second node and third node, respectively.

Though the present invention has been described in accordance with the foregoing examples and preferred modes, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A voltage-controlled oscillator comprising:
   a resonator section in which a plurality of types of variable capacitance elements having different structures and capacitance variation characteristics are connected in parallel and capacitance values of said plurality of types of variable capacitance elements are controlled simultaneously by a control voltage; and
   an amplifier section that maintains oscillation produced by said resonator section,
   wherein the resonator section comprises:
   an inductor;
   a first MOS varactor and a second MOS varactor connected between respective ones of two ends of said inductor and a common node;
   a first varactor diode and a second varactor diode connected between respective ones of two ends of said inductor and a power supply so as to be reverse biased;
   a first resistor connected between the common node and a voltage control terminal;
   a second resistor and a third resistor connected between respective ones of two ends of said inductor and the voltage control terminal; and
   a third varactor diode and a fourth varactor diode which, when the power supply is one of either a high-potential power supply or a low-potential power supply, are connected between the other one of these power supplies and respective ones of two ends of said inductor so as to be reverse biased.

2. The voltage-controlled oscillator according to claim 1, wherein gate terminals of said first and second MOS varactors are connected to the common node.

3. The voltage-controlled oscillator according to claim 1, wherein said amplifier section comprises first and second input/output terminals, and wherein the ends of said inductor are connected to respective ones of said first and second input/output terminals.

4. A voltage-controlled oscillator comprising a resonator section, and an amplifier section that maintains oscillation produced by said resonator section, wherein said resonator section comprises:
   an inductor;
   a first MOS varactor and a second MOS varactor connected between respective ones of two ends of said inductor and a common node;
   a first varactor diode and a second varactor diode connected between respective ones of two ends of said inductor and a power supply so as to be reverse biased;
   third and fourth varactor diodes which, when the power supply is one of either high-potential power supply or a low-potential power supply, are connected between the other one of these power supplies and respective ones of two ends of said inductor so as to be reverse biased;
   a first resistor connected between the common node and a voltage control terminal; and
   second and third resistors connected between respective ones of two ends of said inductor and the voltage control terminal.

5. The voltage-controlled oscillator according to claim 4, wherein gate terminals of said first and second MOS varactors are connected to the common node.

6. The voltage-controlled oscillator according to claim 4, wherein said amplifier section comprises a first and a second input/output terminals, and wherein the ends of said inductor are connected to respective ones of input and output terminals of said amplifier section.

* * * * *